United States Patent

Volmari

[11] Patent Number: 6,097,443
[45] Date of Patent: Aug. 1, 2000

[54] METHOD AND ARRANGEMENT FOR THE ANALOG/DIGITAL CONVERSION OF A PICTURE SIGNAL

[75] Inventor: Frank Volmari, Rellingen, Germany

[73] Assignee: U.S. Philips Corporation, New York, N.Y.

[21] Appl. No.: 09/042,965

[22] Filed: Mar. 17, 1998

[30] Foreign Application Priority Data

Mar. 20, 1997 [DE] Germany .............................. 197 11 613

[51] Int. Cl.[7] .................................. H04N 5/18; H04N 5/52
[52] U.S. Cl. ............................ 348/572; 348/678; 348/689
[58] Field of Search ..................................... 348/572, 573, 348/678, 689; 341/126, 155; H04N 5/52, 5/18

[56] References Cited

U.S. PATENT DOCUMENTS 4,745,461  5/1988  Shirai .
5,175,615  12/1992  Ohara .
5,345,279  9/1994  Takaiwa ................................. 348/689
5,448,300  9/1995  Yamada ................................. 348/572

FOREIGN PATENT DOCUMENTS

3543744A1  10/1986  Germany .

Primary Examiner—Sherrie Hsia
Attorney, Agent, or Firm—Steven R. Biren

[57] ABSTRACT

A method for the analog/digital conversion and an arrangement for the analog-to-digital conversion of an analog signal, particularly a picture signal, into a digital signal by at least two analog-to-digital converters which are clocked by at least two phase-shifted clock signals and whose output signals are combined to a digital picture signal by a multiplexer is disclosed. In order to achieve an individual adaptation to different characteristics of the analog-to-digital converters, each analog-to-digital converter is preceded by an automatic gain control circuit and a clamping stage, which clamps the picture signal at a given amplitude value, the analog signal being applied to the automatic gain control circuit and the clamping stage.

8 Claims, 2 Drawing Sheets

METHOD AND ARRANGEMENT FOR THE ANALOG/DIGITAL CONVERSION OF A PICTURE SIGNAL

BACKGROUND OF THE INVENTION

The invention relates to a method and arrangement for the method for the analog-to-digital conversion of an analog signal, particularly a picture signal, into a digital signal by means of at least two analog-to-digital converters which are clocked in a phase-shifted manner and whose output signals are combined to a digital signal.

Such a method is known from DE-OS 35 43 744 and in said method an analog signal is applied to a plurality of analog-to-digital converters arranged in parallel. The output signals of the analog-to-digital converters are time-interleaved and are available as the output signal. This output signal can have a clock frequency which is n times as high as the sampling frequency of the individual analog-to-digital converters in the case that n analog-to-digital converters are used.

The principal drawback of this method is that in practice the analog-to-digital converters and analog prefilters have different characteristics and different sensitivities. In the output signal, which includes the time-interleaved output signals of the analog-to-digital converters, this gives rise to an inaccuracy which fluctuates in time. For example, even in the case of a constant input signal the output signal can thus have values which fluctuate in time. In addition, it is possible that output signals appear which differ in a quasi-dependent manner on the instant at which the input signal is sampled and, consequently, on the analog-to-digital converter by means of which the signal is sampled. Thus, in this method the sensitivity and/or the characteristic of the circuit and, consequently, the values of the digital output signal change depending on the analog-to-digital converter by which the input signal is being sampled. This is undesirable.

It is an object of the invention to provide a method and an arrangement which mitigate these problems.

SUMMARY OF THE INVENTION

According to the invention this object is achieved for a method in that before the analog-to-digital conversion the analog signal is subjected to automatic gain control and clamping at a given amplitude value separately for the signals applied to the analog-to-digital converters.

The analog signal is applied to each of the analog-to-digital converters. However, before this is done each of the signals applied to the analog-to-digital converters is subjected separately to an automatic gain control and to clamping at a given amplitude value. This enables the input signal of each individual analog-to-digital converter to be adapted to the sensitivity and the characteristic of the analog-to-digital converter and of the prefilter. This means that the analog-to-digital converters supply digital output signals which have been derived from the analog input signal with the same characteristic and the same sensitivity. Thus, in the overall output signal of the method a digital signal is obtained which has been derived from the analog input signal with the same sensitivity and the same characteristic at any instant. Therefore, this output signal no longer exhibits any fluctuations in time.

In a variant of the method in accordance with the invention an anti-aliasing filtering is effected separately for the signals applied to the analog-to-digital converters. It may be advantageous to use anti-aliasing filtering which rejects those frequencies which, in accordance with the sampling theorem in dependence upon the sampling frequency of the analog-to-digital converters, cannot be converted anyway by these converters and would therefore only lead to noise in the output signal.

In a further variant of the method in accordance with the invention the automatic gain control and/or clamping is/are effected in dependence upon the digital signal.

It is possible to provide a fixed compensation for different sensitivities and/or characteristics of the analog-to-digital converters. However, in accordance with this advantageous variant, it is alternatively possible to effect automatic gain control and clamping in dependence upon the digital signal, so that it is possible not only to effect an individual adaptation of the gain control and the clamping in dependence upon the sensitivities and the characteristics of the analog-to-digital converters but also to effect a time adaptation of these parameters, for example in order to compensate also for temperature drift of the analog-to-digital converters.

In a further variant of the method in accordance with the invention the clock frequency $f_{sample}$ of the clock signals applied to the analog-to-digital converters, the clock frequency $f_{clock}$ of the digital signal, and the number m of analog-to-digital converters comply with $$m = \frac{f_{clock}}{f_{sample}}.$$

Thus, it is possible to generate a digital signal which appears with a clock frequency which is m times as high as possible with a single analog-to-digital converter.

For an arrangement for the analog-to-digital conversion of an analog signal, particularly a picture signal, into a digital signal by means of at least two analog-to-digital converters which are clocked by at least two phase-shifted clock signals and whose output signals are combined to a digital picture signal by means of a multiplexer, the afore-mentioned object is achieved in that each analog-to-digital converter is preceded by an automatic gain control circuit and a clamping stage, which clamps the picture signal at a given amplitude value, the analog signal being applied to said automatic gain control circuit and said clamping stage.

The analog signal is first applied to circuits for automatic gain control and clamping stages. For each individual analog-to-digital converter there has been provided such an automatic gain control circuit as well as a clamping stage. This enables the signals applied to the analog-to-digital converters to be adapted individually to the properties of the analog-to-digital converters and analog prefilters as regards the sensitivity and characteristics. Thus, the different sensitivities and characteristics of the converters are corrected in such a manner that the output signal is derived from the analog input signal with each time the same sensitivity and characteristic, independently of the fact by which of the analog-to-digital converters it has been sampled.

In an embodiment of the arrangement in accordance with the invention the multiplexer is followed by a control circuit, which controls the automatic gain control circuit and/or the clamping stages in dependence upon the amplitude values of the digital signal.

The output signals of the various analog-to-digital converters are combined to form the output signal of the arrangement by means of the multiplexer. In this output signal of the arrangement the output signals of the analog-to-digital converters appear in time windows which succeed one another in time. Thus, it is known in which time window the output signal of which analog-to-digital converter appears. This output signal is analyzed by means of the control signal and, depending on the amplitude values of the digital signal, the automatic gain control circuits and/or clamping stages associated with the respective analog-to-digital converters are controlled in such a manner that the digital signal appears with the desired sensitivity and/or characteristic. In this way, not only the individually different characteristics of the analog-to-digital converters are compensated for but, in addition, a time correction is applied to compensate, for example, for possible temperature drift of the analog-to-digital converters.

BRIEF DESCRIPTION OF THE DRAWING

An arrangement in accordance with the invention, which operates in accordance with the inventive method, will be described in more detail hereinafter with reference to the drawings. In the drawings.

DESCRIPTION OF THE PREFERRED EMBODIMENTS

Figure 1:
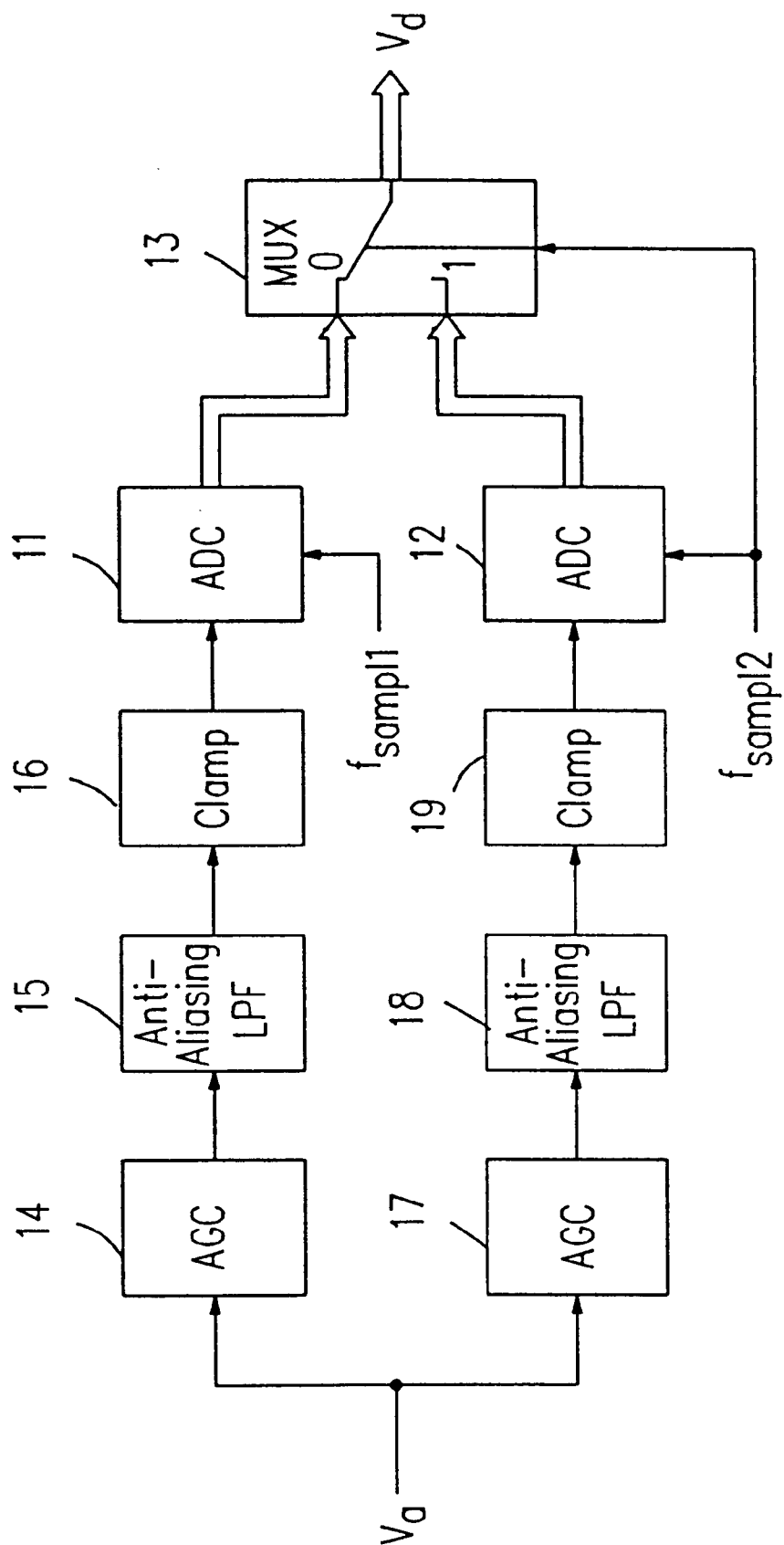
FIG. 1 shows an arrangement including two analog-to-digital converters, each preceded by separate circuits for automatic gain control, for clamping and for anti-aliasing filtering.

An arrangement in accordance with the invention for the analog-to-digital conversion of an analog signal $V_a$ into a digital signal $V_d$, which arrangement is shown as a block diagram in FIG. 1, comprises a first analog-to-digital converter 11 and a second analog-to-digital converter 12.

The first analog-to-digital converter 11 is clocked by means of a clock signal $f_{sampl1}$ and the second analog-to-digital converter 12 is clocked by means of a clock signal $f_{sampl2}$. Both clock signals have the same frequency but are phase-shifted relative to one another.

By means of a multiplexer 13 the output signals of the analog-to-digital converters 11 and 12 are combined to a common digital signal, which forms the output signal $V_d$ of the arrangement. The multiplexer 13 is clocked by means of the second clock signal $f_{sampl2}$ and switches over between the output signals of the two analog-to-digital converters 11 and 12 upon each positive edge and upon each negative edge.

As a result of the phase shift between the two clock signals $f_{sampl1}$ and $f_{sampl2}$ it is achieved that the analog input signals of the analog-to-digital converters 11 and 12 are sampled at different instants. These sampled values are time-interleaved by means of the multiplexer.

As explained above, the arrangement serves to convert the analog picture signal $V_a$ applied to its input into the digital signal $V_d$. However, since the two analog-to-digital converters 11 and 12 may have different sensitivities and/or characteristics, the analog signal $V_a$ is processed separately. This means that for each the two analog-to-digital converters 11 and 12 the signal is separately adapted to their different properties.

Thus, the analog signal $V_a$ is applied to an automatic gain control circuit 14, which is followed by an anti-aliasing filter 15, whose output signal is transferred to a clamping stage 16 which precedes the first analog-to-digital converter 11.

The gain of the analog signal is adjusted by means of the automatic gain control circuit. The offset of the signal can be adjusted by means of the clamping stage 16. Thus, the signal applied to the analog-to-digital converter 11 is adapted to the properties of the analog-to-digital converter 11 with regard to these parameters. This adaptation is effected separately for this converter 11.

In a corresponding manner, the second analog-to-digital converter 12 is preceded by an automatic gain control circuit 17, an anti-aliasing filter 18 and a clamping stage 19, which in a corresponding manner adapt the analog signal to the properties of the analog-to-digital converter 12.

The result is that for each of the analog-to-digital converters 11 and 12 (or for any further analog-to-digital converters which may have been provided) the analog signal $V_a$ can be adapted separately to the properties of these converters and to those of the anti-aliasing filters, so that at any instant the output signal $V_b$ of the arrangement is obtained with the same parameters by sampling of the analog signal $V_a$. Consequently, these parameters no longer exhibit any fluctuations in time in the output signal $V_d$.

The anti-aliasing filters 15 and 18 in addition serve to reject those frequency components in the analog signal which in dependence upon the respective sampling frequencies $f_{sampl1}$ and $f_{sampl2}$ cannot be converted anyway by the analog-to-digital converters 11 and 12, respectively, and therefore would only lead to noise in the output signal.

Figure 2:
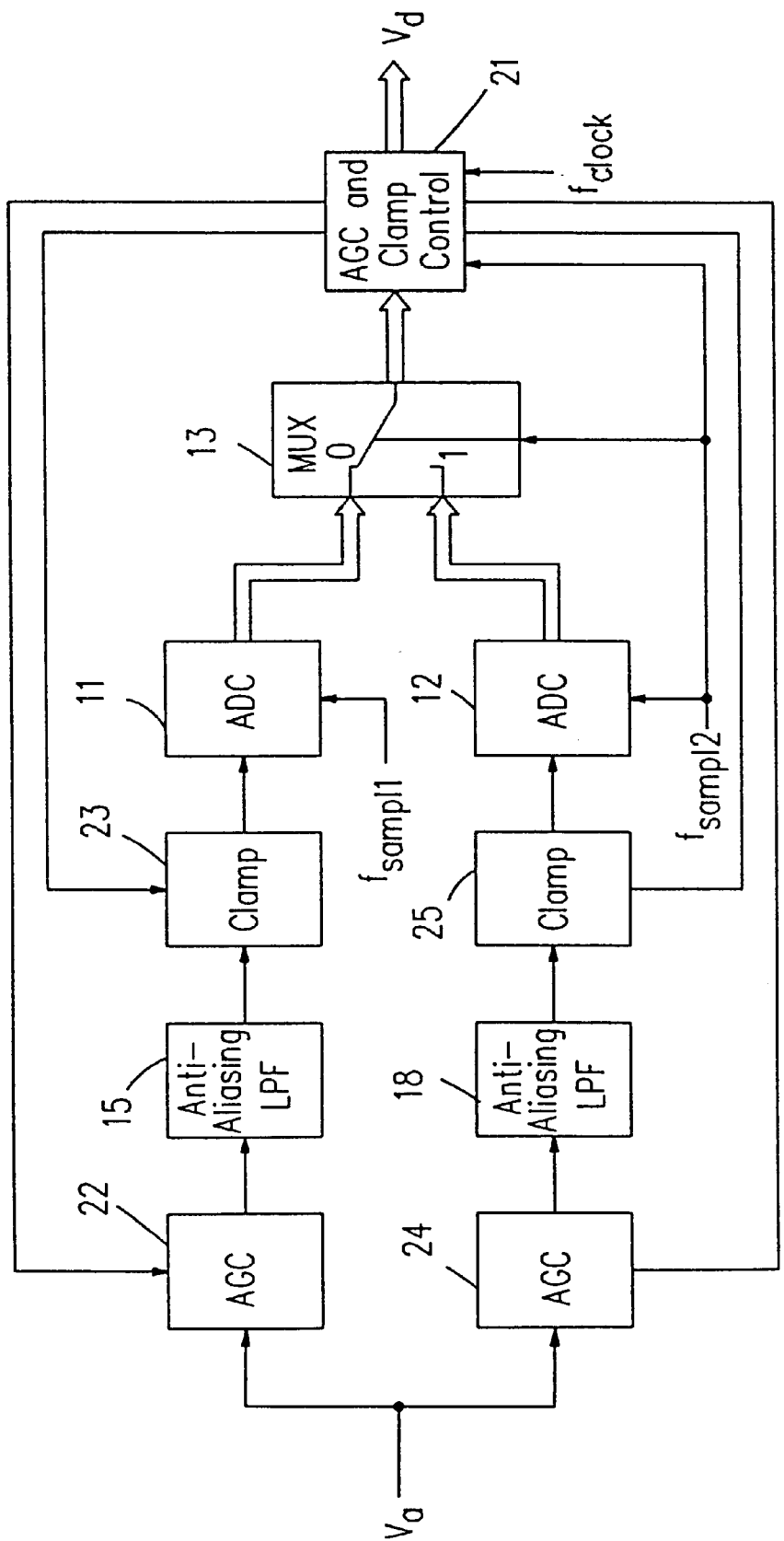
FIG. 2 shows an arrangement which is similar to that in FIG. 1 and which in addition individually controls the automatic gain control circuits and of the clamping stages in dependence upon the digital signal.

FIG. 2 shows a block diagram of an arrangement in accordance with the invention which is similar to that shown in FIG. 1 and which in addition controls the automatic gain control circuits 22 and 24 and the clamping stages 23 and 25 in dependence upon the digital signal $V_d$.

For this purpose, the multiplexer 13 is followed by a control device 21 which extracts sampled values from the digital signal $V_d$. Since the output signals of the analog-to-digital converters 11 and 12 appear in the digital signal $V_d$ in time-interleaved time slots, the output signal, i.e. its values, can be assigned to the respective analog-to-digital converters 11 and 12.

In dependence upon these values, which are individually assigned to the respective analog-to-digital converters 11 and 12, the automatic gain control circuits 22 and 24 and the clamping stages 23 and 25 can be controlled depending upon the digital output signal $V_d$.

Thus, the control device 21 makes it possible to effect at any time a comparison of the analog signals as passed through the circuits 22 or 24 and 23 or 25, respectively, with the values converted into digital form. In this way, it is possible to adapt the gain and the offset of these values by an appropriate control of the automatic gain control circuits and the clamping stages.

Thus, it is possible not only to use a fixed presetting of the automatic gain control circuits 22 and 24 and the clamping stages 23 and 25 but these circuits can also be adapted to possible variations in time of the sensitivity values or the characteristics of the analog-to-digital converters 11 and 12 and the anti-aliasing filters 15 and 18. Such variations of these parameters as a function of time can arise, for example, as a result of temperature drift.

What is claimed is:

1. A method for the analog-to-digital conversion of a single analog signal, particularly a picture signal, into a digital signal by providing at least two analog-to-digital converters, clocking said analog-to-digital converters in a phase-shifted manner and combining their output signals to form a digital signal, comprising, before each analog-to-digital conversion, subjecting the analog signal to automatic gain control and clamping at a given amplitude value separately, to thereby generate at least two analog signals to be applied to the at least two analog-to-digital converters.

2. A method as claimed in claim 1, characterized in that an anti-aliasing filtering is effected separately for the analog signals applied to the analog-to-digital converters.

3. A method as claimed in claim 1, characterized in that the automatic gain control and/or clamping is/are effected in dependence upon the digital signal.

4. A method as claimed in claim 1, characterized in that a clock frequency $f_{sample}$ of clock signals applied to the analog-to-digital converters clock a frequency $f_{clock}$ of the digital signal, and the number m of analog-to-digital converters comply with $$m = \frac{f_{clock}}{f_{sample}}.$$

5. An arrangement for the analog-to-digital conversion of a single analog signal, particularly a picture signal, into a digital signal by means of at least two analog-to-digital converters which are clocked by at least two phase-shifted clock signals and whose output signals are combined to a digital picture signal by means of a multiplexer, characterized in that each analog-to-digital converter is preceded by an automatic gain control circuit and a clamping stage, which clamps the picture signal at a given amplitude value, the single analog signal being applied to said automatic gain control circuit and said clamping stage.

6. An arrangement as claimed in claim 5, characterized in that each analog-to-digital converter is preceded by an anti-aliasing filter.

7. An arrangement as claimed in claim 5, characterized in that the multiplexer is followed by a control circuit, which controls the automatic gain control circuit and/or the clamping stages in dependence upon the amplitude values of the digital signal.

8. An arrangement as claimed in claim 5, characterized in that the clock frequency $f_{sample}$ of the clock signals applied to the analog-to-digital converters, the clock frequency $f_{clock}$ of the digital signal, and the number m of analog-to-digital converters comply with $$m = \frac{f_{clock}}{f_{sample}}.$$

* * * * *